United States Patent
Lim et al.

(10) Patent No.: US 9,439,326 B1
(45) Date of Patent: Sep. 6, 2016

(54) ELECTRONIC COMPONENTS

(71) Applicants: Jae-Sung Lim, Cheonan-si (KR);
Ju-Hyung Kim, Seoul (KR)

(72) Inventors: Jae-Sung Lim, Cheonan-si (KR);
Ju-Hyung Kim, Seoul (KR)

(73) Assignee: HANA MICRON, INC., Asan-si (KR)

( * ) Notice: Subject to any disclaimer, the term of this patent is extended or adjusted under 35 U.S.C. 154(b) by 0 days.

(21) Appl. No.: 14/723,805

(22) Filed: May 28, 2015

(51) Int. Cl.
H05K 7/20 (2006.01)
H05K 1/02 (2006.01)
H05K 1/11 (2006.01)
H05K 1/00 (2006.01)
H01L 23/34 (2006.01)

(52) U.S. Cl.
CPC .............. H05K 7/205 (2013.01); H05K 1/028 (2013.01); H05K 1/111 (2013.01)

(58) Field of Classification Search
CPC .......... H05K 1/00; H05K 1/16; H05K 1/028; H05K 1/115; H05K 1/189; H05K 1/144; H05K 1/149; H05K 3/0008; H05K 3/323; H05K 3/40; H05K 3/0058; H05K 5/0004; H05K 7/20; H01L 23/02; H01L 23/24; H01L 23/34; H01L 23/48; H01L 23/28; H01L 23/29; H01L 23/053; H01L 23/5387; G06F 1/20
USPC .............. 361/679.46, 679.54, 704, 705, 707, 361/710, 715, 718, 749, 750, 760, 763, 762, 361/767, 768; 257/686, 687, 688, 706, 717, 257/692, 738; 174/254, 260; 29/832, 842
See application file for complete search history.

(56) References Cited

U.S. PATENT DOCUMENTS

| | | | | |
|---|---|---|---|---|
| 4,677,528 A * | 6/1987 | Miniet | ................ | H01L 23/5387 235/488 |
| 6,992,376 B2 * | 1/2006 | Jaeck | ................. | H01L 23/5387 174/254 |
| 8,159,066 B2 * | 4/2012 | Yang | ........................ | H01L 23/36 257/621 |
| 8,476,828 B2 * | 7/2013 | Hayashi | ............... | B60Q 3/0253 313/504 |
| 2006/0056161 A1 * | 3/2006 | Shin | ....................... | G01L 19/146 361/749 |
| 2010/0096175 A1 * | 4/2010 | Ishimatsu | ................... | C09J 7/00 174/260 |
| 2010/0253902 A1 * | 10/2010 | Yamazaki | ............. | G02F 1/1303 349/158 |
| 2013/0050227 A1 * | 2/2013 | Petersen | ............... | H01L 23/053 345/501 |
| 2014/0355226 A1 * | 12/2014 | Kim | ........................ | H05K 3/323 361/749 |
| 2015/0076683 A1 | 3/2015 | Lim et al. | | |
| 2015/0319843 A1 * | 11/2015 | Lim | ........................ | H05K 1/189 361/679.32 |

FOREIGN PATENT DOCUMENTS

KR 2012-0043577 10/2013
KR 2012-0043584 1/2014

* cited by examiner

*Primary Examiner* — Michail V Datskovskiy
(74) *Attorney, Agent, or Firm* — Daly, Crowley Mofford & Durkee, LLP

(57) ABSTRACT

An electronic component may include an integrated circuit device package and a second substrate. The integrated circuit device package may include a first substrate being bent or spread, a heat transfer member disposed in the first substrate, an integrated circuit device being bent or spread, a first pad disposed on one face of the integrated circuit device, and an adhesion member disposed between the integrated circuit device and the first substrate. The second substrate may be bent or spread. The second substrate may include a second pad. The integrated circuit device package may be combined with the second substrate by a thermo compression bonding process in which the heat transfer member may transfer a heat to the second substrate through the first substrate and the first pad may make contact with the second pad.

7 Claims, 3 Drawing Sheets

ELECTRONIC COMPONENTS

BACKGROUND

1. Field

Example embodiments of the invention relate to electronic components. More particularly, example embodiments of the invention relate to electronic components randomly bent or spread as demands.

2. Related Technology

Recently, as electronic devices are widely used for various applications, packing technologies for integrated circuit devices such as semiconductor memory devices are required to ensure that an integrated circuit device package has a high capacity, a thin thickness, a reduced size, etc. To satisfy these requirements of the recent integrated circuit device package, various solutions have been developed. Particularly, a flexible integrated circuit device has been developed recently, and thus a flexible integrated circuit device package for the flexible integrated circuit device has been developed. The inventors have invented flexible integrated circuit device packages, and have filed these inventions to Korean Intellectual Property Office (KIPO) as Korean Patent Application Nos. 2012-0043854 and 2012-0043577.

However, current technologies for the flexible integrated circuit device packages do not properly meet the above requirements of the flexible integrated circuit device package, and thus more efficient technologies for the flexible integrated circuit device packages and electronic components having the flexible integrated circuit device packages are still required.

SUMMARY

Example embodiments of the invention provide an electronic component including integrated circuit device package randomly bent or spread to be advantageously applied in various applications.

According to one aspect of the invention, there is provided an electronic component including an integrated circuit device package and a second substrate. The integrated circuit device package may include a first substrate being randomly bent or spread, a heat transfer member disposed in the first substrate, an integrated circuit device being randomly bent or spread, a first pad disposed on one face of the integrated circuit device, and an adhesion member disposed between the integrated circuit device and the first substrate. The second substrate may be randomly bent or spread. The second substrate may include a second pad. In example embodiments, the integrated circuit device package may be combined with the second substrate by a thermo compression bonding process in which the heat transfer member may transfer a heat to the second substrate through the first substrate and the first pad may make contact with the second pad.

In example embodiments, the first substrate may include a flexible film such as a polyimide (PI) film. The integrated circuit device may have a thickness in a range of about 1.0 µm to about 150 µm. Additionally, the adhesion member may include a flexible film such as an attach film for a die bonding, or a double-sided tape.

In example embodiments, the first substrate may have at least one through hole and at least one heat transfer member may be disposed in the through hole. For example, the heat transfer member may include copper (Cu), aluminum (Al), iron (Fe), an alloy thereof and/or a mixture thereof.

In some example embodiments, the heat transfer member may be substantially buried in the first substrate. For example, the heat transfer member may have a substantial bar structure or a substantial rod structure. Alternatively, a plurality of heat transfer members may be disposed in the first substrate. Here, the heat transfer members may be separated by a predetermined distance.

In example embodiments, the second substrate may include a flexible substrate such as a glass substrate or a flexible printed circuit board.

In example embodiments, the thermo compression bonding process may be carried out at a temperature in a range of about 100° C. to about 400° C.

According to example embodiments of the invention, the electronic component may include the integrated circuit device package having the heat transfer member disposed in the through hole of the first substrate or substantially buried in the first substrate, so that the heat transfer member may efficiently transfer a heat to the second substrate through the first substrate in the thermo compression bonding process. Therefore, the integrated circuit device package may be stably and effectively combined with the second substrate. Further, the heat transfer member may efficiently dissipate a heat from the electronic component in an operation of the electronic component.

DESCRIPTION OF EMBODIMENTS

Figure 1:
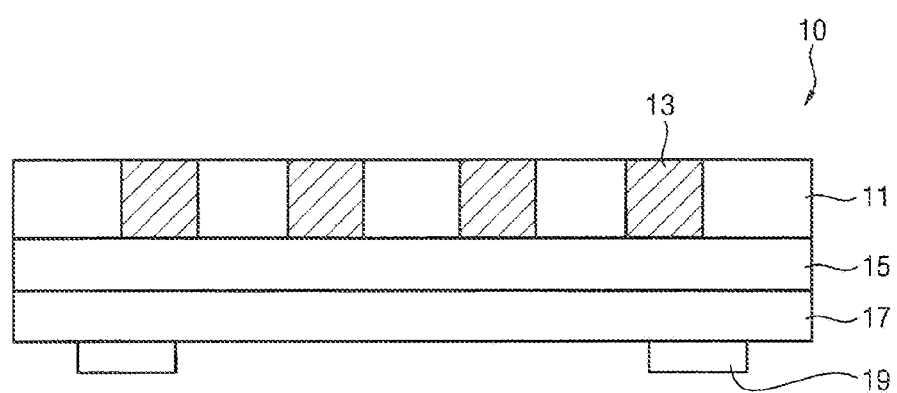
FIGS. 1 to 3 are cross-sectional views illustrating a method of manufacturing a flexible electronic component in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

Like numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention. The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

EMBODIMENTS

Figure 2:
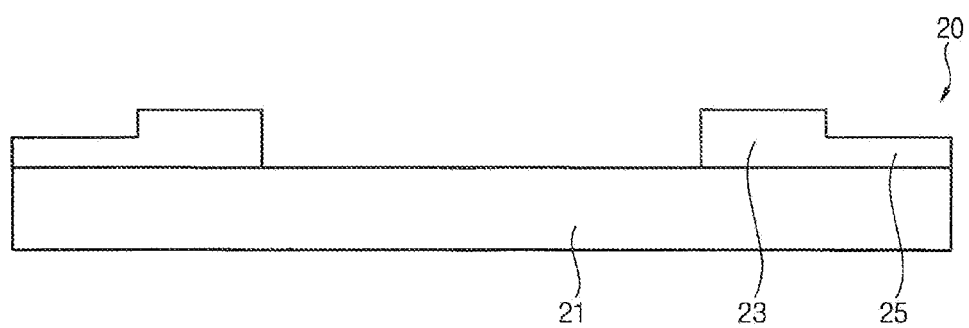
Figure 3:
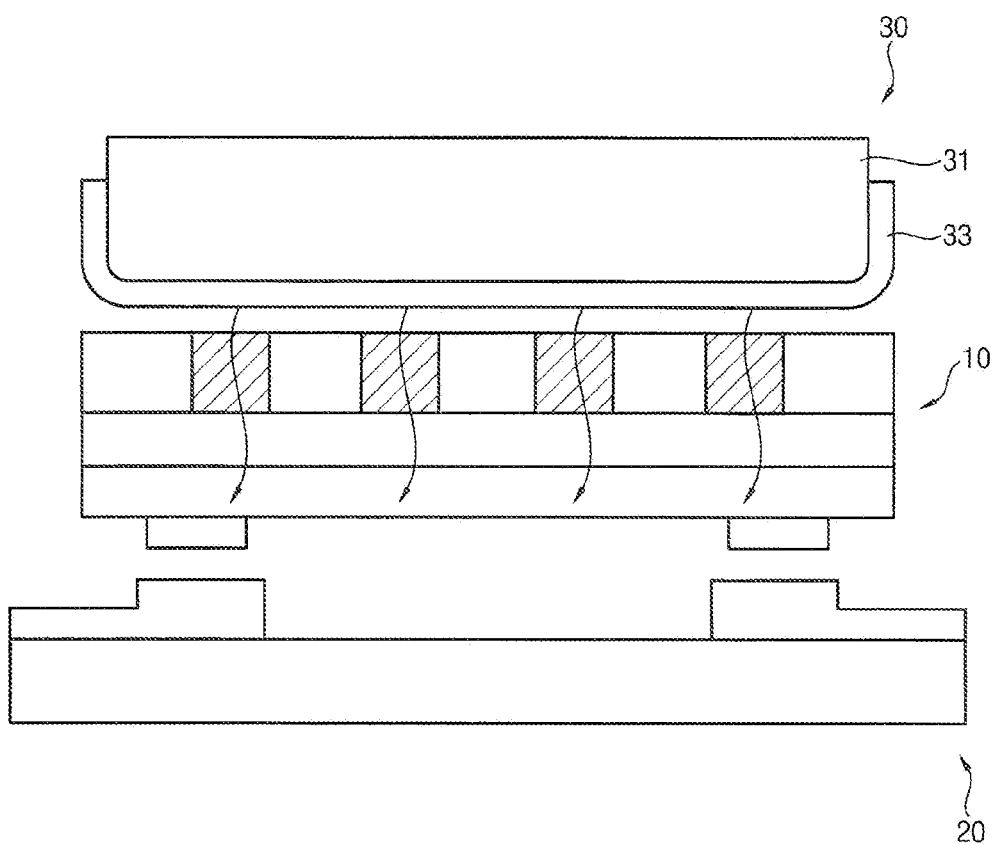

FIGS. 1 to 3 are cross-sectional views illustrating a method of manufacturing a flexible electronic component in accordance with example embodiments of the invention.

Referring to FIG. 1, an integrated circuit device package 10 may be provided. In example embodiments, the integrated circuit device package 10 may include a first substrate 11, an integrated circuit device 17, an adhesion member 15, etc. The integrated circuit device package 10 may be flexible to be bent or spread as occasion demands.

The first substrate 11 may include a flexible substrate. For example, the first substrate 11 may include a flexible film such as a polyimide film. When the first substrate 11 includes the polyimide film, the first substrate 11 may not be deformed or damaged by a heat applied to the first substrate 11 in a successive a thermo compression bonding process. In example embodiments, the flexible film for the first substrate 11 may have a good heat resistance.

According to example embodiments, the first substrate 11 may have a good thermal conductivity such that the heat may be sufficiently transferred to a second substrate 20 (see FIG. 2) through the first substrate 11 in the thermo compression bonding process. In case that the heat is not sufficiently transferred to the second substrate 20 in the compression bonding process, the second substrate 20 may be combined with the integrated circuit device package 10 having the first substrate 11.

When the first substrate 11 includes the polyimide film, the heat may not be sufficiently transferred to the second substrate 20 through the first substrate 11 during the thermo compression bonding process. In other words, the first substrate 11 including the polyimide film may not have a good thermal conductivity while ensuring the good heat resistance.

According to example embodiments, the integrated circuit device package 10 may include a heat transfer member 13 for the heat transfer to the second substrate 20 through the first substrate 11. The heat transfer member 13 may be disposed in the first substrate 11. For example, both faces of the heat transfer member 13 may be exposed from the first substrate 11. In example embodiments, the first substrate 11 may have a plurality of through holes and a plurality of heat transfer members 13 may be disposed in the through holes of the first substrate 11. Adjacent heat transfer members 13 may be separated by the substantially same distance. Here, each of the heat transfer members 13 may have various cross sections, for example, a substantially circular cross section, a substantially elliptical cross section, a triangular cross section, a square cross section, a rectangular cross section, a track cross section, etc.

The heat transfer member 13 may include a material having a good thermal conductivity. For example, the heat transfer member 13 may include copper (Cu), aluminum (Al), iron (Fe), an alloy of these metals, etc. These may be used alone or in a mixture thereof.

As described above, the integrated circuit device package 10 may include the first substrate 11 including the flexible film and at least one heat transfer member 13 disposed in the first substrate 11. Thus, the first substrate 11 may ensure the good thermal conductivity by the heat transfer 13 while ensuring the sufficient heat resistance.

When the heat transfer members 13 are disposed in the through holes of the first substrate 11, the heat transfer members 13 may additionally prevent the bending of the first substrate 11 while partially holding the first substrate 11 in successive processes even though the first substrate 11 has the plurality of through holes. As a result, the failure of the integrated circuit device package 10 caused by the bending of the first substrate 11 may be effectively prevented or reduced because of the heat transfer members 13 located in the first substrate 11.

In some example embodiments, although not illustrated, the integrated circuit device 17 of the integrated circuit device package 10 may additionally include a semiconductor device such as a memory device, a non-memory device, etc. Further, the integrated circuit device 17 may include an active device, a passive device, etc.

Referring to FIG. 1 again, the integrated circuit device 17 may also include a flexible structure to be randomly bent or spread as demands. In example embodiments, the integrated circuit device 17 may include a silicon substrate having a relatively thin thickness. For example, the silicon substrate for the integrated circuit device 17 may have a thickness in a range of several micrometers to several scores of micrometers. In one example embodiment, the integrated circuit device 17 may have a thickness in a range of about 1.0 µm to about 150 µm. In a certain example embodiment, the integrated circuit device 17 may have a thickness in a range of about 5.0 µm to about 50 µm. When the integrated circuit device 17 has a thickness below 1.0 µm, the integrated circuit device 17 may not ensure a desired configuration. In case that the integrated circuit device 17 has a thickness above 150 µm, the integrated circuit device 17 may not be properly bent of spread.

As illustrated in FIG. 1, the integrated circuit device package 10 may additionally include a first pad 19 disposed on a bottom face of the integrated circuit device 17. The first pad 19 may electrically connect the integrated circuit device 17 to the second substrate 20. In example embodiments, a plurality of first pads 19 may be disposed on the bottom face of the integrated circuit device 17. Here, the first pads 19 may be located in a peripheral region of the integrated circuit device 17.

The integrated circuit device 17 may be combined with the first substrate 11 by interposing the adhesion member 15 therebetween. For example, the adhesion member 15 may be disposed between a top face of the integrated circuit device 17 and a bottom face of the first substrate 11. Hence, the integrated circuit device package 10 may have a configuration in which the first substrate 11 and the integrated circuit device 17 are substantially integrally formed.

In the combination of the integrated circuit device 17 and the first substrate 11 according to example embodiments, the adhesion member 15 may be attached to the first substrate 11, and then the integrated circuit device 17 may be attached to the adhesion member 15 on the first substrate 11 from a rolling roll. That is, the integrated circuit device 17 may be combined with the first substrate 11 using the rolling roll having the integrated circuit device 17 thereon. In example embodiments, the top face of the integrated circuit device 17 may be attached to the adhesion member 15 such that the first pad 19 may be exposed after combining of the integrated circuit device 17 relative to the first substrate 11.

The adhesion member 15 may also include a flexible film. For example, the adhesion member 15 may include an attach film for a die bonding, or a double-sided tape, etc.

According to example embodiments of the invention, the integrated circuit device package 17 may include the flexible integrated circuit device 17, the flexible adhesion member 15 and the flexible first substrate 11 so that the integrated circuit device package 10 may be randomly bent or spread as demands. Additionally, the integrated circuit device package 10 may include the heat transfer member 13 for improving the heat transfer in the thermo compression bonding process. Moreover, because the heat transfer member 13 may fill the through hole of the first substrate 11, the heat transfer member 13 may prevent the bending of the first substrate 11 in the successive processes to thereby preventing or reducing failure of the integrated circuit device package 10.

Referring now to FIG. 2, the second substrate 20 may be provided. The second substrate 20 may include a flexible substrate. For example, the second substrate 20 may include a relatively thin glass substrate or a relatively thin flexible printed circuit board.

In example embodiments, an electronic component may be a display device when the second substrate 20 includes the thin glass substrate. In some example embodiments, the electronic component may be a memory device such as a memory card being randomly bent or spread when the second substrate 20 includes the thin printed circuit board.

When the second substrate 20 includes the thin glass substrate, the thermo compression bonding process for combining the integrated circuit device package 10 with the second substrate 20 may include a chip on glass (COG) process. Alternatively, the thermo compression bonding process may include a chip on flexible printed circuit board (COF) process in case that the second substrate 20 includes the thin printed circuit board.

The second substrate 20 may include a second pad 23 disposed thereon. The second pad 23 may be positioned in a peripheral region of the second substrate 20. In example embodiments, a plurality of second pads 23 may be disposed on a top face of the second substrate 20. The second pads 23 may substantially correspond to the first pads 19, respectively. The second pad 23 may be electrically connected to a wiring 25 extended on the second substrate 20.

Referring to FIG. 3, the flexible integrated circuit device package 10 may be combined with the flexible second substrate 20. Thus, an electronic component having a required flexibility may be provided by substantially integrally combining the integrated circuit device package 10 with the second substrate 20. The electronic component may be the display device in case that the second substrate 20 includes the thin glass substrate. Alternatively, the electronic component may be the memory device when the second substrate 20 includes the thin printed circuit board.

In example embodiments, the integrated circuit device package 10 may be combined with the second substrate 20 by the thermo compression bonding process. For example, the top face of the second substrate 20 may face with the bottom face of the integrated circuit device 17. The second pad 23 of the second substrate 20 may make contact with the first pad 19 of the integrated circuit device 17. In example embodiments, the plurality of second pads 23 may contact the plurality of first pads 19, respectively. Thus, the integrated circuit device 17 may be electrically connected to the second substrate 20 through the first and the second pads 19 and 23.

The thermo compression bonding process may be performed using a thermo compression bonding apparatus 30. In example embodiments, the thermo compression bonding apparatus 30 may include a bonding head 31 and a cushion member 33. The cushion member 33 may at least partially enclose the bonding head 31 as illustrated.

In the thermo compression bonding process, the thermo compression bonding apparatus 30 may be placed on the first substrate 11 of the integrated circuit device package 10. For example, the bonding head 31 may be located on the top face of the first substrate 11 and the cushion member 33 may be disposed between the bonding head 31 and the first substrate 11. The heat may be transferred to the second substrate 20 from the bonding head 31 through the first substrate 11 to thereby thermally combine the integrated circuit device package 10 with the second substrate 20.

In example embodiments, the at least one heat transfer member 13 may be located in the first substrate 11, so that the heat may be efficiently transferred to the second substrate 20 through the first substrate 11 in the thermo compression bonding process. Therefore, the integrated circuit device package 10 may be more easily and stably combined with the second substrate 20.

If the heat is transferred to the second substrate 20 through the first substrate 11 without the heat transfer member 13, the integrated circuit device package 10 may not be stably combined with the second substrate 20 because the heat may not be sufficiently transferred from the bonding heat 31 to the second substrate 20 through the first substrate 11 having the heat resistance. According to example embodiments, the integrated circuit device package 10 may include the heat transfer member 13 positioned in the first substrate 11, so the heat may be efficiently and rapidly transferred to the second substrate 20 from the bonding head 31 through the first substrate 11. Hence, the thermo compression bonding process for combining the integrated circuit device package 10 with the second substrate 20 may be effectively and rapidly accomplished.

When the thermo compression bonding process is carried out at a temperature below 100° C., the integrated circuit device package 10 may not be sufficiently combined with the second substrate 20 because of a relatively low temperature. In case that the thermo compression bonding process is carried out at a temperature above 400° C., thermal stress may be generated in the integrated circuit device package 10 and/or the second substrate 20. Thus, the thermo compression bonding process may be performed at a temperature in a range of about 100° C. to about 400° C.

According to example embodiments of the invention, the integrated circuit device package 10 may be efficiently and stably combined with the second substrate 20 by the above-described thermo compression bonding process utilizing the heat transfer member 13 disposed in the first substrate 11.

Figure 4:
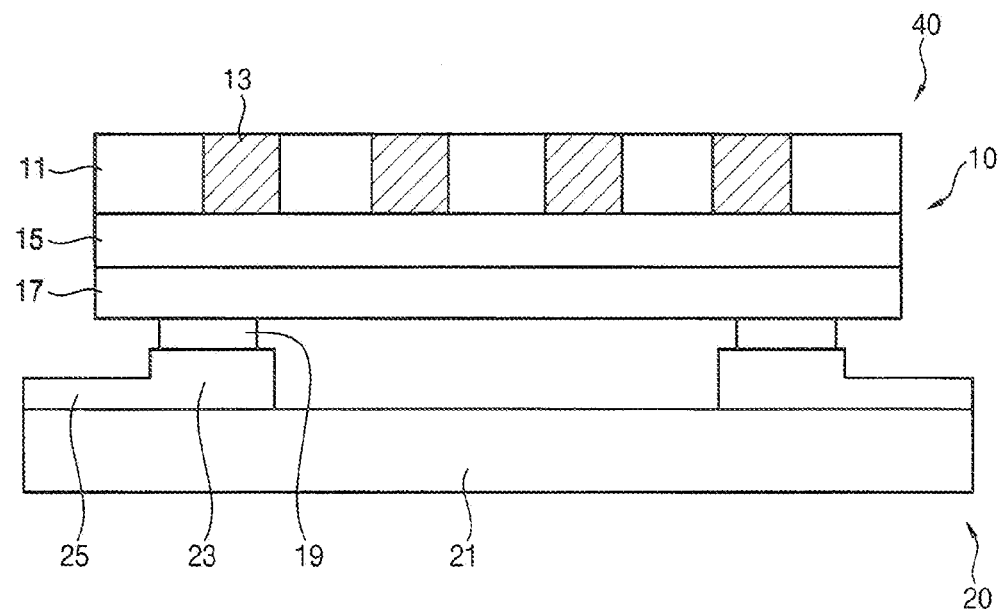
FIG. 4 is a cross-sectional view illustrating a flexible electronic component in accordance with example embodiments of the invention.

FIG. 4 is a cross-sectional view illustrating a flexible electronic component in accordance with example embodiments of the invention.

Referring to FIG. 4, an electronic component 40 may include an integrated circuit device package 10 and a second substrate 20 which may have configurations substantially the same as those described with reference to FIGS. 1 and 2. The electronic component 40 may be obtained by a thermo compression bonding process substantially the same as the thermo compression bonding process described with reference to FIG. 3. The integrated circuit device package 10 may be integrally combined with the second substrate 20.

In some example embodiments, the electronic component 40 may include a heat transfer member 13 substantially the same as that described with reference to FIG. 1. Additionally, the heat transfer member 13 may dissipate a heat generated in the electronic component 40. That is, the heat transfer member 13 may effectively transfer the heat in the thermo compression bonding process for combining the integrated circuit device package 10 with the second substrate 20, and may further efficiently dissipate the heat generated from the electronic component 40 in an operation of the electronic component 40.

According to example embodiments, the electronic component 40 may include at least one heat transfer member 13 disposed in the first substrate 11, such that the heat may be effectively transferred to the second substrate 20 through the heat transparent member 13 in the thermo compression bonding process. The integrated circuit device package 10 may be easily and stably combined with the second substrate 20 to thereby advantageously manufacture the electronic component 40. Further, the heat transfer member 13 may prevent or reduce a thermal stresses of the electronic component 40 by dissipating the heat generated in the electronic component 40 in the operation of the electronic component 40. Hence, a failure of the electronic component 40 caused by the thermal stress may be efficiently prevented or reduced.

Figure 5:
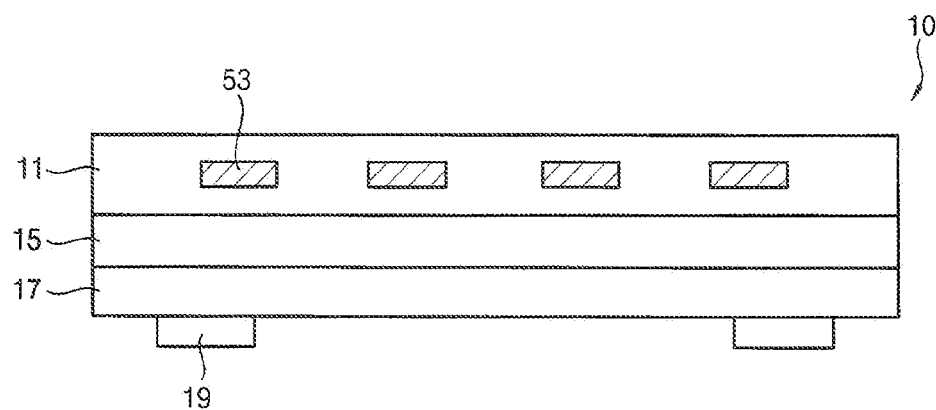
FIG. 5 is a cross-sectional view illustrating a flexible electronic component in accordance with some example embodiments of the invention.

FIG. 5 is a cross-sectional view illustrating a flexible electronic component in accordance with some example embodiments of the invention. In FIG. 5, an integrated circuit device package 10 may have a configuration substantially the same as that described with reference to FIG. 1.

Referring to FIG. 5, the integrated circuit device package 10 may include a heat transfer member 53 substantially buried in a first substrate 11. In example embodiments, a plurality of heat transfer members 53 may be substantially buried in the first substrate 11. In other words, the first substrate 11 may substantially enclose at least one heat transfer member 53.

When the heat transfer member 53 is buried in the first substrate 11, a void or a cavity may not be generated in the heat transfer member 53 because the heat transfer member 53 is not disposed in the above-described through hole of the first substrate 11, or an overhang of the heat transfer member 53 is not generated in the through hole of the first substrate 11. Thus, the heat transfer member 53 may more efficiently transfer a heat in a thermo compression bonding process, and also may more effectively dissipate a heat from the electronic component.

In some example embodiments, the heat transfer member 53 may be disposed along a length of the first substrate 11. For example, the heat transfer member 53 may have a substantial bar structure or a substantial rod structure. Here, the heat transfer member 53 may have various cross sections, for example, a substantially circular cross section, a substantially elliptical cross section, a triangular cross section, a square cross section, a rectangular cross section, a track cross section, etc.

According to the invention, an electronic component may include an integrated circuit device package and a second substrate which may be combined each other by a thermo compression bonding process. Because the electronic component may include a heat transfer member disposed in a through hole of a first substrate or substantially buried in the first substrate, the heat transfer member may efficiently transfer a heat to the second substrate through the first substrate in a thermo compression bonding process for combining the integrated circuit device package with the second substrate. Thus, the integrated circuit device package may be stably and easily combined with the second substrate. Additionally, the heat transfer member may efficiently dissipate a heat from the electronic component in an operation of the electronic component, so that a failure of the electronic component caused by a thermal stress may be prevented. Furthermore, the heat transfer member may have a simple structure disposed in the first substrate, such that a yield of the electronic component may be increased while simplifying manufacturing processes for the electronic component.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An electronic component comprising:
   an integrated circuit device package including a first substrate being bent or spread, a heat transfer member disposed in the first substrate, an integrated circuit device being bent or spread, a first pad disposed on one face of the integrated circuit device, and an adhesion member disposed between the integrated circuit device and the first substrate; and
   a second substrate being bent or spread, the second substrate including a second pad,
   wherein the integrated circuit device package is combined with the second substrate by a thermo compression bonding process in which the heat transfer member transfers a heat to the second substrate through the first substrate and the first pad makes contact with the second pad.

2. The electronic component of claim 1, wherein the first substrate includes a polyimide film, the integrated circuit device has a thickness in a range of about 1.0 µm to about 150 µm, and the adhesion member includes an attach film for a die bonding, or a double-sided tape.

3. The electronic component of claim 1, wherein the first substrate has a through hole and the heat transfer member is disposed in the through hole.

4. The electronic component of claim 1, wherein the heat transfer member is buried in the first substrate.

5. The electronic component of claim 4, wherein the heat transfer member has a bar structure or a rod structure.

6. The electronic component of claim 1, wherein a plurality of heat transfer members are disposed in the first substrate.

7. The electronic component of claim 1, wherein the second substrate includes a glass substrate or a flexible printed circuit board.

* * * * *